(12) United States Patent
Dussaigne

(10) Patent No.: US 11,424,386 B2
(45) Date of Patent: Aug. 23, 2022

(54) MULTI-COLOR LIGHT-EMITTING DEVICE AND METHOD OF MANUFACTURING SUCH A DEVICE

(71) Applicant: Commissariat à l'Énergie Atomique et aux Énergies Alternatives, Paris (FR)

(72) Inventor: Amélie Dussaigne, Grenoble (FR)

(73) Assignee: Commissariat á l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/659,947

(22) Filed: Oct. 22, 2019

(65) Prior Publication Data

US 2020/0135976 A1 Apr. 30, 2020

(30) Foreign Application Priority Data

Oct. 29, 2018 (FR) ...................................... 1871328

(51) Int. Cl.
*H01L 33/32* (2010.01)
*H01L 33/00* (2010.01)
(Continued)

(52) U.S. Cl.
CPC ........ *H01L 33/325* (2013.01); *H01L 33/0075* (2013.01); *H01L 33/06* (2013.01); *H01L 33/145* (2013.01); *H01L 33/24* (2013.01)

(58) Field of Classification Search
CPC ... H01L 33/325; H01L 33/0075; H01L 33/06; H01L 33/145; H01L 33/24; H01L 33/01;
(Continued)

(56) References Cited

U.S. PATENT DOCUMENTS

2002/0096994 A1* 7/2002 Iwafuchi ............. H01L 21/2007
257/E27.111
2003/0087467 A1* 5/2003 Oohata ................... H01L 33/22
438/47
(Continued)

FOREIGN PATENT DOCUMENTS

EP 2 390 930 A2 11/2011

OTHER PUBLICATIONS

Preliminary Search Report for French Application No. 1871328, dated May 23, 2019.
(Continued)

*Primary Examiner* — Su C Kim
(74) *Attorney, Agent, or Firm* — Wolf, Greenfield & Sacks, P.C.

(57) ABSTRACT

A light-emitting device including first, second, and third pixels, wherein: the first pixel includes a two-dimensional light-emitting cell including a vertical stack of a first semiconductor layer of a first conductivity type, of an active layer, and of a second semiconductor layer of the second conductivity type; each of the second and third pixels includes a three-dimensional light-emitting cell including a plurality of nanostructures of same dimensions regularly distributed across the surface of the pixel, each nanostructure including a doped pyramidal semiconductor core of the first conductivity type, an active layer coating the lateral walls of the core, and a doped semiconductor layer of the second conductivity type coating the active layer; and the nanostructures of the second and third pixels have different dimensions and/or a different spacing.

12 Claims, 2 Drawing Sheets

(51) Int. Cl.
*H01L 33/06* (2010.01)
*H01L 33/14* (2010.01)
*H01L 33/24* (2010.01)

(58) Field of Classification Search
CPC ............... H01L 27/156; H01L 27/1214; H01L 27/1259
See application file for complete search history.

(56) References Cited

U.S. PATENT DOCUMENTS

2015/0221814 A1* 8/2015 Ohlsson .............. H01L 33/0075
438/35
2017/0323925 A1 11/2017 Schneider, Jr. et al.

OTHER PUBLICATIONS

Gmili et al., Mask effect in nano-selective-area-growth by MOCVD on thickness enhancement, indium incorporation, and emission of InGaN nanostructures on AlN-buffered Si (111) substrates. Optical Materials Express. Feb. 1, 2017;7(2):376-85.

* cited by examiner bar # MULTI-COLOR LIGHT-EMITTING DEVICE AND METHOD OF MANUFACTURING SUCH A DEVICE This application claims priority to French patent application number 18/71328, the content of which is hereby incorporated by reference in its entirety to the maximum extent allowable by law.

TECHNICAL BACKGROUND

The present disclosure generally concerns light-emitting devices based on semiconductor materials and methods of manufacturing the same. It more particularly aims at the forming of a multi-color light-emitting display device, that is, comprising a plurality of pixels, among which pixels of different types are respectively capable of emitting light in different wavelength ranges.

PRIOR ART

A light-emitting display device conventionally comprises a plurality of pixels, each pixel being individually controllable to convert an electric signal into a light ray. More particularly, each pixel comprises a light-emitting cell comprising a stack of a first doped semiconductor layer of a first conductivity type, of an active layer, and of a second doped semiconductor layer of the second conductivity type. In operation, an electric current is applied between the first and second semiconductor layers of the cell. Under the effect of this current, the active layer emits a light ray in a wavelength range which essentially depends on its composition. Each pixel may further comprise a control circuit, for example comprising one or a plurality of transistors, enabling to control the intensity of the current applied to the light-emitting cell of the pixel, and accordingly the intensity of the light ray emitted by the pixel.

To enable to display multi-color images, the display device should comprise a plurality of pixels of different types capable of respectively emitting in different wavelength ranges.

To form a multi-color display device, a possibility is to transfer onto same substrate pixels formed separately based on different semiconductor materials. The bonding and the alignment of the pixels on the transfer substrate may however by delicate to achieve. In particular, such a technique is not adapted to the forming of display devices having a small pitch between pixels, for example, smaller than 10 μm.

Another possibility is to form a display device where all the light-emitting cells of the pixels all emit in the same wavelength range, the light-emitting cells of certain pixels being coated with a color conversion layer, for example, a layer incorporating quantum dots or nanophosphors, capable of converting the light ray emitted by the light-emitting cell into a light ray in another wavelength range. The local deposition of color conversion layers may however be difficult to achieve, particularly on pixels of small dimensions. Further, the durability of color conversion materials is generally relatively limited.

Another possibility is to successively form the light-emitting cells of the pixels of different types during distinct local epitaxy sequences, by modifying for each sequence the composition of the deposited layers to obtain pixels with a direct emission in different wavelength ranges. A disadvantage of this method however is its high cost, due to the implementation of a plurality of successive epitaxy sequences to successively form the light-emitting cells of the different types of pixels.

SUMMARY

There is a need for a multi-color light-emitting display device and for a method of manufacturing such a device, overcoming all or part of the disadvantages of known solutions.

Thus, an embodiment provides a light-emitting device comprising first, second, and third pixels capable of respectively emitting in first, second, and third wavelength ranges, wherein:
the first pixel comprises a two-dimensional light-emitting cell comprising a vertical stack of a first doped semiconductor layer of a first conductivity type, of an active layer, and of a second doped semiconductor layer of the second conductivity type;
each of the second and third pixels comprises a three-dimensional light-emitting cell comprising a plurality of nanostructures of same dimensions regularly distributed across the surface of the pixel, each nanostructure comprising a doped pyramidal semiconductor core of the first conductivity type, an active layer coating the lateral walls of the core, and a doped semiconductor layer of the second conductivity type coating the active layer; and
the nanostructures of the second and third pixels have different dimensions and/or a different spacing.

According to an embodiment, in each of the first, second, and third pixels, the active layer comprises an alternation of semiconductor layers of a first material and of semiconductor layers of a second material defining multiple quantum wells.

According to an embodiment, in each of the first, second, and third pixels, the first material is InGaN and the second material is GaN or InGaN having an indium concentration lower than that of the first material.

According to an embodiment, the first semiconductor layer of the first pixel and the semiconductor cores of the second and third pixels are made of N-type doped GaN or of N-type doped InGaN.

According to an embodiment, the second semiconductor layer of the first pixel and the doped semiconductor layers of the second conductivity type of the second and third pixels are made of P-type doped GaN or of P-type doped InGaN.

According to an embodiment, the device comprises a substantially planar base semiconductor layer having a surface coated with a substantially planar dielectric masking layer, the masking layer comprising, opposite the first pixel, a single opening laterally delimiting the first semiconductor layer of the first pixel and, opposite each of the second and third pixels, a plurality of openings laterally delimiting the semiconductor cores of the second and third pixels, the first semiconductor layer of the first pixel and the semiconductor cores of the second and third pixels being arranged on top of and in contact with said surface of the base semiconductor layer, in said openings.

Another embodiment provides a method of manufacturing a device such as defined hereabove, wherein the first semiconductor layer of the first pixel and the semiconductor cores of the second and third pixels are simultaneously formed during a same epitaxy step.

According to an embodiment, the first semiconductor layer of the first pixel and the semiconductor cores of the second and third pixels are formed by local epitaxy on a surface of a base semiconductor layer coated with a dielectric masking layer.

According to an embodiment, the dielectric masking layer comprises, opposite each of the second and third pixels, a plurality of openings regularly distributed across the entire surface of the light-emitting cell of the pixel.

According to an embodiment, the openings are formed by etching of the dielectric masking layer opposite pores of a film having a controlled porosity formed based on block copolymers.

According to an embodiment, the active layers of the first, second, and third pixels are simultaneously formed during a same epitaxy step.

According to an embodiment, the epitaxial growth conditions on forming of the active layers of the first, second, and third pixels are the following:
growth temperature of 720° C.+/−30° C.;
growth speed of 0.12 μm/h+/−0.007 μm/h;
Indium/Gallium flow ratio in the range from 2 to 5;
V/III semiconductor ratio greater than 5,000; and
pressure in the order of 400 mbar.

According to an embodiment, the second semiconductor layer of the first pixel and the semiconductor layers of the second and third pixels are simultaneously formed during a same epitaxy step.

The foregoing and other features and advantages will be discussed in detail in he following non-limiting description of specific embodiments in connection with the accompanying drawings.

DESCRIPTION OF THE EMBODIMENTS

Figure 1:
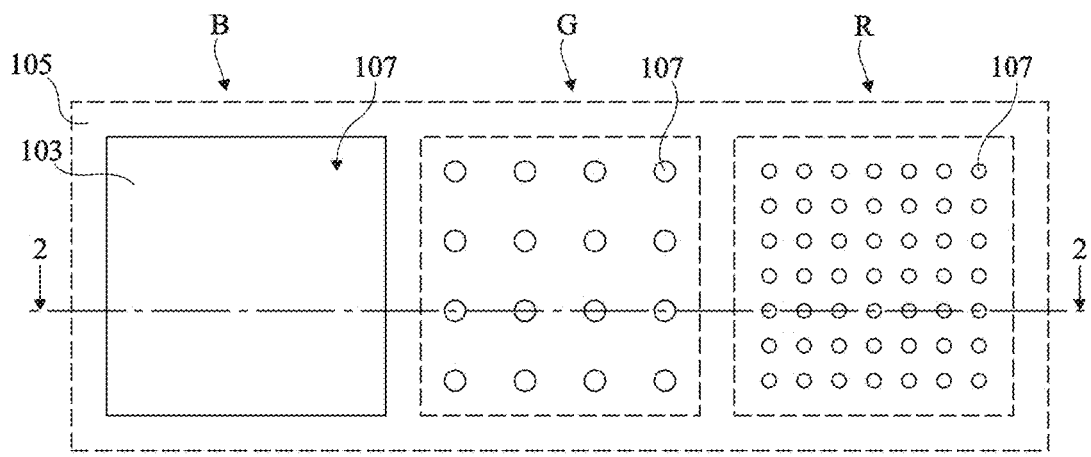
FIG. 1 is a top view schematically and partially showing a step of light-emitting display device manufacturing method according to an embodiment.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the forming of the light-emitting cells of the pixels of a multi-color light-emitting display device is more particularly considered. The forming of the pixel control circuits and of possible insulation structures between the light-emitting cells of the pixels has not been detailed, the forming of these elements being within the abilities of those skilled in the art.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings, it being understood that, in practice, the described devices may be oriented differently.

The terms "about", "approximately", "substantially", and "in the order of" are used herein to designate a tolerance of plus or minus 10%, preferably of plus or minus 5%, of the value in question.

FIGS. 1 to 7 show successive steps of an example of a multi-color light-emitting display device method according to an embodiment.

The forming of a display device comprising three types of different pixels, capable of respectively emitting in three different wavelength ranges, is considered herein as an example. More particularly, it is desired in the present example to form a display device comprising one or a plurality of pixels of a first type, called blue pixels, capable of mainly emitting blue light, for example, in a wavelength range from 400 to 490 nm, one or a plurality of pixels of a second type, called green pixels, capable of mainly emitting green light, for example, in a wavelength range from 490 to 570 nm, and one or a plurality of pixels of a third type, called red pixels, capable of mainly emitting red light, for example, in a wavelength range from 570 to 710 nm. FIGS. 1 to 7 show a single blue pixel B, a single green pixel G, and a single red pixel R, it being understood that, in practice, the display device may comprise a plurality of pixels of each type, the pixels of a same type being identical or similar to within manufacturing dispersions.

In this example, in each pixel, the active layer of the light-emitting cell of the pixel comprises confinement means corresponding to multiple quantum wells. More particularly, the active layer comprises an alternation of semiconductor layers of a first material and of semiconductor layers of a second material, each layer of the first material being sandwiched between two layers of the second material, the first material having a band gap narrower than that of the second material.

As an example, each of the first and second materials mainly comprises a III-V compound comprising at least a first group-III element, a second group-V element, and, possibly, a third element, for example, a group-III element other than the first element.

Examples of group-III elements comprise gallium (Ga), indium (In), or aluminum (Al). Examples of group-V elements comprise nitrogen, phosphorus, or arsenic. Examples of binary and ternary III-V compounds are GaN, AlN, InN, InGaN, AlGaN, or AlInGaN. Generally, the elements in the III-V compound may be combined with different molar fractions.

In a preferred embodiment, the first material is InGaN and the second material is GaN or InGaN having an indium concentration smaller than that of the first material.

According to an aspect of an embodiment, it is provided to simultaneously form the light-emitting cells of the three types of pixels, during a same epitaxy step sequence.

For this purpose, the geometry of the light-emitting cells of the different pixels is varied so as to, during a same epitaxial growth step, obtain different indium concentrations in the active layers of the pixels of different types, and thus to obtain different wavelength ranges of emission by the light-emitting cells of the pixels of different types.

More particularly, in the example described in relation with FIGS. 1 to 7, the light-emitting cells of the blue pixels B of the device are two-dimensional cells, each formed of a stack of substantially planar semiconductor layers extending continuously over the entire surface of the cells. The light-emitting cells of the green and red pixels G and R of the device are three-dimensional cells, each comprising a plurality of identical or similar pyramidal nanostructures, regularly distributed over the surface of the cell, each nanostructure comprising a pyramid-shaped semiconductor core, the active layer of the cell being formed on the lateral surfaces of the semiconductor core of each nanostructure. In the present example, the light-emitting cells of the green pixels differ from the light-emitting cells of the red pixels essentially by the dimensions and/or the spacing of their respective pyramidal nanostructures. More particularly, in the present example, the pyramidal nanostructures of red pixels have dimensions smaller than those of the pyramidal nanostructures of green pixels, and the pitch between pyramids, that is, the center-to-center distance between two neighboring pyramidal nanostructures, is smaller in red pixels than in green pixels.

FIGS. 1 (top view) and 2 (cross-section view along plane 2-2 of FIG. 1) show an initial structure comprising a growth substrate 101, for example, made of sapphire ($Al_2O_3$), of silicon carbide (SiC) or of silicon (Si), and, on the upper surface of substrate 101, an N-type doped gallium nitride layer (GaN) 103. Layer 103 is for example formed by epitaxy on the upper surface of substrate 101. A buffer layer (not shown) may possibly form an interface between the upper surface of substrate 101 and layer 103. In this example, layer 103 continuously extends over the entire surface of the display device. The thickness of layer 103 is for example substantially uniform over the entire surface of the device.

Figure 2:
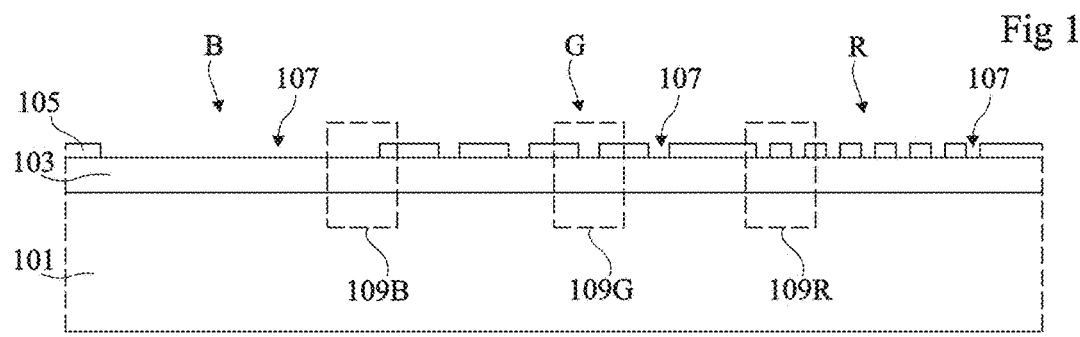
FIG. 2 is a cross-section view of the structure of FIG. 1.

FIGS. 1 and 2 more particular illustrate a step of forming of a mask 105 on the upper surface of layer 103. Mask 105 is for example made of a dielectric material, for example, of silicon nitride (for example, $Si_3N_4$). Mask 105 comprises, opposite each pixel of the device, one or a plurality of through openings 107 emerging onto the upper surface of layer 103, defining the shape of the future light-emitting cell of the pixel. More particularly, in this example, mask 105 comprises:

opposite blue pixel B, a single opening 107, for example, of square or rectangular shape (in top view), extending substantially across the entire surface of the future light-emitting cell of the pixel;
opposite green pixel G, a plurality of identical or similar openings 107, for example, of circular shape (in top view), regularly distributed across the entire surface of the future light-emitting cell of the pixel; and
opposite red pixel R, a plurality of identical or similar openings 107, for example, of circular shape (in top view), regularly distributed across the entire surface of the future light-emitting cell of the pixel.

As an example, the openings 107 formed opposite green pixel G, respectively red pixel R, are, in top view, arranged in an array of rows and of columns. As an example, the light-emitting cells of pixels B, G, and R have, in top view, the same general shape, for example, a square or rectangular shape, and the same lateral dimensions. The described embodiments are however not limited to this specific case.

As an example, the lateral dimensions of opening 107 formed opposite pixel B are in the range from 1 to 20 µm, preferably from 5 to 10 µm. As an example, each of the openings 107 formed opposite pixel G has a lateral dimensions (width or diameter) in the range from 100 to 300 nm, preferably in the order of 200 nm, and the pitch (center-to-center distance) between neighboring openings 107 opposite pixel G is in the range from 1 to 3 µm, for example in the order of 2 µm. As an example, each of the openings 107 formed opposite pixel R has a lateral dimension in the range from 10 to 100 nm, preferably from 20 to 50 nm, and the pitch between neighboring openings 107 opposite pixel R is in the range from 100 nm to 1 µm, preferably from 200 nm to 500 µm. The thickness of mask 105 is for example in the range from 10 to 100 nm, preferably from 20 to 40 nm.

Openings 107 are for example formed by photolithography or also by electron beam lithography. To define openings 107 of very small dimensions, particularly opposite pixel R, an alternative solution to photolithography or to electron beam lithography comprises depositing a film having a controlled porosity based on block copolymers on the upper surface of mask 105, and then etching mask 105 opposite the pores of the copolymer film to form openings 107. An example of implementation of such a method is for example described in the article entitled "Density Multiplication and Improved Lithography by Directed Block Copolymer Assembly" of Ricardo Ruiz et al (Science 15 Aug. 2008: Vol. 321, Issue 5891, pp. 936-939).

FIGS. 3 to 7 illustrate various deposition steps subsequent to the forming of mask 105. For clarity, only a portion of pixel B, corresponding to an enlargement of area 109B of FIG. 2, a portion of pixel G, corresponding to an enlargement of area 109G of FIG. 2, and a portion of pixel R, corresponding to an enlargement of area 109R of FIG. 2, have been shown in these drawings.

Figure 3:
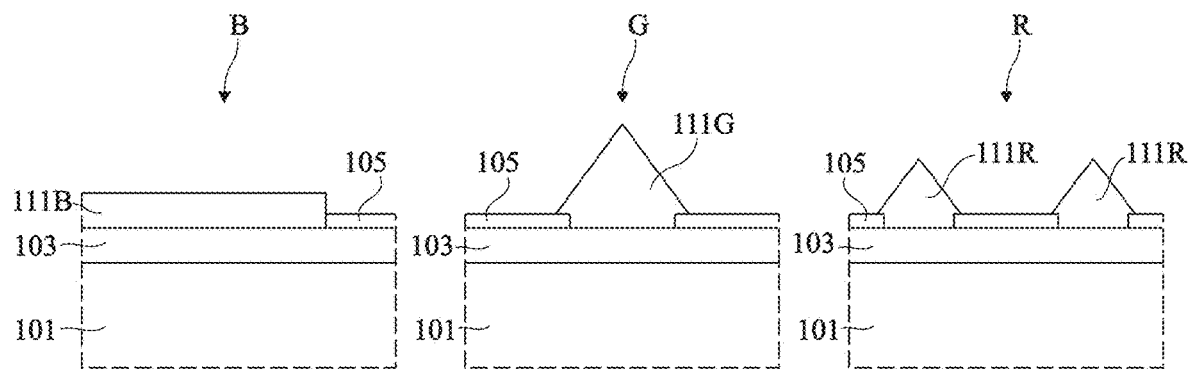
FIG. 3 is a cross-section view schematically and partially showing another step of a light-emitting display device manufacturing method according to an embodiment.

FIG. 3 illustrates a step of epitaxial deposition of an N-type doped semiconductor material on the upper surface of the structure of FIGS. 1 and 2. During this step, the epitaxial growth is performed from the upper surface of layer 103, at the bottom of openings 107. The deposition is thus located opposite openings 107 of mask 105. The deposited material is for example, N-type doped GaN or N-type doped InGaN. The epitaxy is carried out simultaneously in all the pixels of the device. The epitaxy is for example performed by MOCVD ("MetalOrganic Chemical Vapor Deposition").

In pixel B, due to the relatively significant dimensions of opening 107, the growth is substantially uniform, which results in the forming of a substantially planar layer 111B extending over the entire surface of opening 107. In pixel G, respectively in pixel R, due to the small dimensions of openings 107, a pyramidal nanostructure 111G, respectively 111R, corresponding to the core of an elementary pyramidal structure of the future light-emitting cell of the pixel, are obtained opposite each opening 107. Structures 111G, 111R for example have the shape of hexagonal pyramids. In the case where layer 103 is made of GaN, the upper surface of layer 103 preferably corresponds to the surface of gallium polarity of layer 103, to favor a pyramidal growth opposite the openings 107 of pixels G and R.

As an example, at the end of the growth step of FIG. 3, layer 111B has a thickness in the range from 10 to 100 nm, and each of pyramids 111G and 111R has a height substantially equal, for example, equal to within 30%, to the width of the opening 107 opposite which it is formed.

Figure 4:
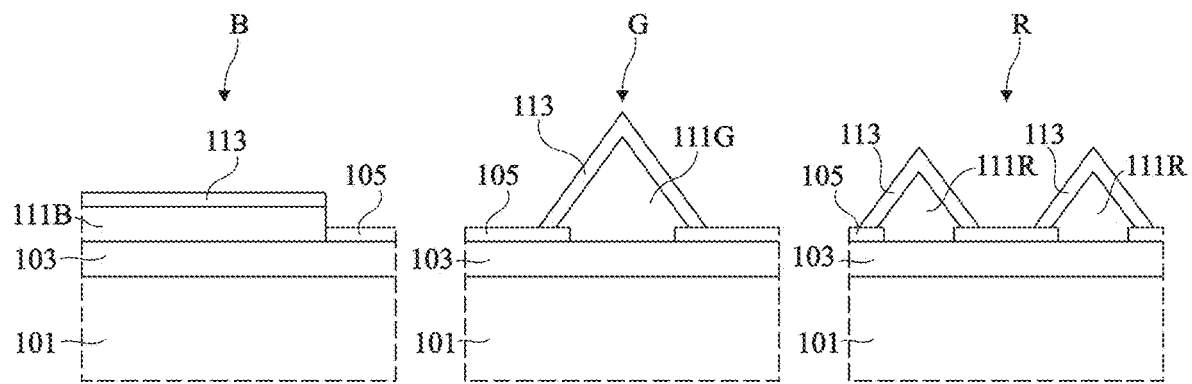
FIG. 4 is a cross-section view schematically and partially showing another step of a light-emitting display device manufacturing method according to an embodiment.

FIG. 4 illustrates a step of epitaxial deposition of a layer 113 of an N-type doped semiconductor material on the upper surface of the structure of FIG. 3. During this step, the epitaxial growth is performed from the upper surface of layer 111B in pixel B, and from the lateral surfaces of pyramids 111G and 111R in pixels G and R. The deposition is thus located opposite layer 111B and pyramidal structures 111G, 111B of the structure of FIG. 3. The epitaxy is simultaneously carried out in all the pixels of the device. The epitaxy is for example performed by MOCVD. The deposited material thus is N-type doped GaN or N-type doped InGaN. As an example, the deposited material is the same as during the step of FIG. 3, but a growth stop is provided between the step of FIG. 3 and the step of FIG. 4. The thickness of layer 113 deposited during this step is for example substantially the same in all the pixels of the device, for example, in the range from 50 to 250 nm, for example, in the order of 100 nm. Layer 113 forms a buffer layer, and particularly forms a shell around pyramids 111G, 111R for a subsequent step of deposition of the active layers of the light-emitting cells of the pixels.

Figure 5:
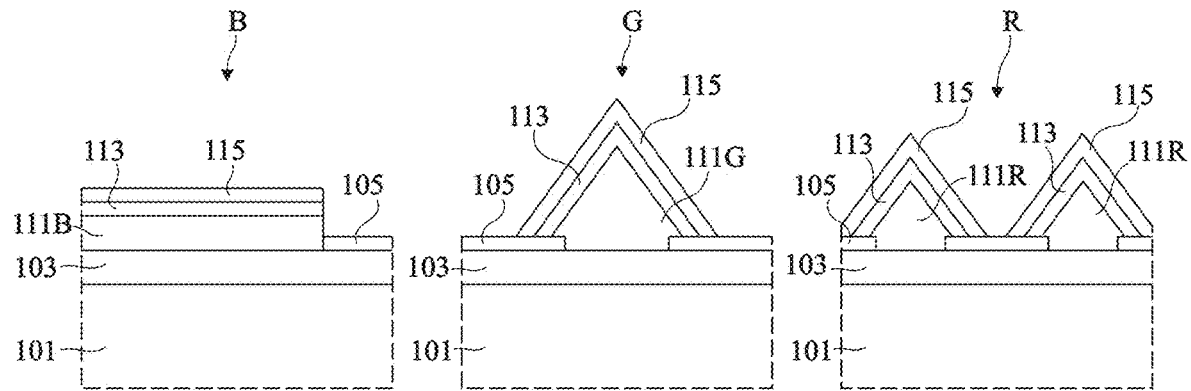
FIG. 5 is a cross-section view schematically and partially showing another step of a light-emitting display device manufacturing method according to an embodiment.

FIG. 5 illustrates a step of epitaxial deposition of an active layer 115 in pixels B, G, and R of the device. During this step, the epitaxial growth is performed from the upper surface of layer 113 in pixel B, and from the lateral surfaces of the pyramidal shells formed by layer 113 in pixels G and R. The deposition is thus located opposite planar layer 113 in pixel B, and opposite the pyramidal shells formed by layer 113 in pixels G and R. The epitaxy is carried out simultaneously in all the device pixels. The epitaxy is for example performed by MOCVD. During this step, an alternation of semiconductor layers of a first material, for example, InGaN, and of semiconductor layers of a second material having a wider bandgap than that of the first material, for example, GaN or InGaN having an indium concentration lower than that of the first material, to form a stack of quantum wells, for example, a stack of from 1 to 10 quantum wells, is deposited. As an example, the total thickness of active layer 115 is in the range from 10 to 100 nm. The conditions of epitaxial growth of active layer 115 are for example as follows:

growth temperature of 720° C.+/−30° C.;
growth speed of 0.12 μm/h+/−0.007 μm/h;
In/Ga flow ratio in the range from 2 to 5;
V/III ratio greater than 5,000 and preferably of 10,000 or more;
pressure in the order of 400 mbar or more; and
well thickness in the range from 2 to 3 nm.

The thickness of active layer 115 is for example substantially the same in all the pixels of the device. However, due to the growth surface geometry differences between pixels B, G, and R, the indium concentration in each InGaN layer of active layer 115 is different in pixels B, G, and R (and this, despite identical epitaxy conditions for all the active layers of pixels B, G, and R, since they are simultaneously carried out in a single step). It should in particular be noted that the pyramids have semi-polar planes favorable to the incorporation of indium. More, particularly, a lower indium concentration is obtained in pixel B than in pixel G, and a lower indium concentration is obtained in pixel G than in pixel R. This provides different emission wavelength ranges in pixels B, G, and R and, more particularly, in the present example, an emission mainly in blue in pixel B, an emission mainly in green in pixel G, and an emission mainly in red in pixel R.

Figure 6:
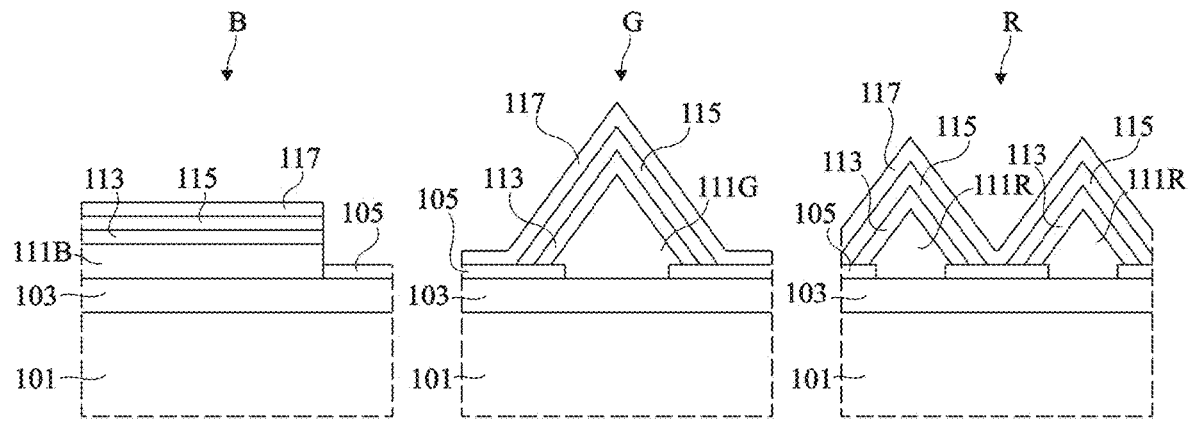
FIG. 6 is a cross-section view schematically and partially showing another step of a light-emitting display device manufacturing method according to an embodiment.

FIG. 6 illustrates a step of epitaxial deposition, in each pixel, of a layer 117 of a P-type doped semiconductor material on the upper surface of active layer 115. Layer 117 is simultaneously deposited in all the pixels of the device. Layer 117 for example extends continuously over the entire surface of the light-emitting cell of the pixel. Layer 117 is for example deposited by MOCVD. Active layer 117 is for example deposited across a sufficiently large thickness to form, on each of pixels G and R, a coalesced layer extending over the entire surface of the light-emitting cell of the pixel. The deposited material is for example P-type doped GaN or P-type doped InGaN. The thickness of layer 117 is for example in the range from 50 to 250 nm, for example, in the order of 100 nm.

Although this has not been shown in the drawings, an electronic barrier may be deposited between active layer 115 and P-type layer 117. Further, spacers, for example, a non-intentionally doped semiconductor material, may be deposited based on the pyramidal nanostructures of pixels G and R, for example, between N-type layer 113 and active layer 115, and/or between active layer 115 and P-type layer 117.

Figure 7:
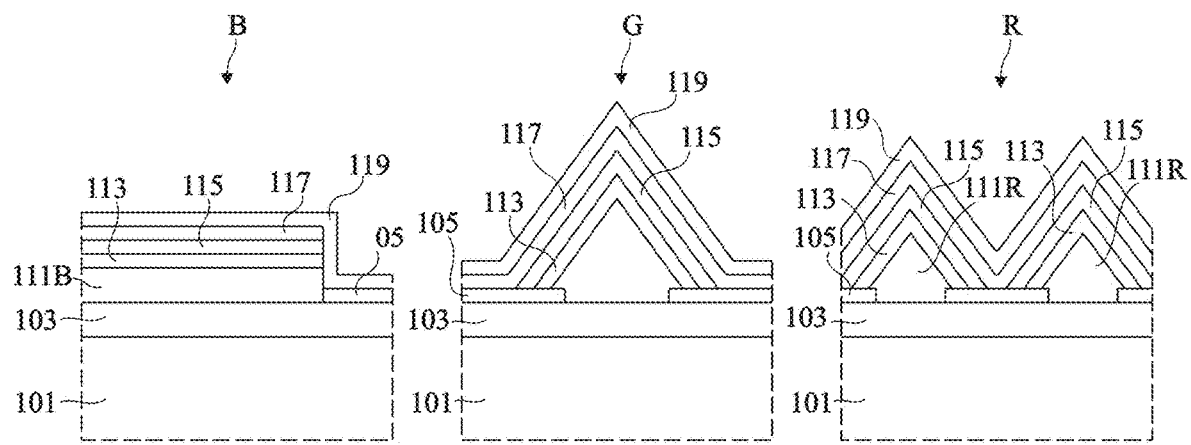
FIG. 7 is a cross-section view schematically and partially showing another step of a light-emitting display device manufacturing method according to an embodiment.

FIG. 7 illustrates a step of deposition, in each pixel, of a conductive layer 119 on top of and in contact with the upper surface of P-type layer 117. Layer 119 is simultaneously deposited in all the pixels of the device. As an example, in each pixel, layer 119 continuously extends over the entire surface of the light-emitting cell of the device. Layer 119 is for example deposited by a method of conformal deposition to have a substantially constant thickness over the entire surface of the light-emitting cell. Layer 119 particularly enables, in each of the pixels G and R of the device, to take a collective contact on P-type layer 117 in all the pyramids of the pixel. In each of the pixels G and R, a collective contact may further be taken on N-type layer 113 in all the pyramids of the pixel, via layer 103 and cores 111R, 111G. Layer 119 is for example made of a transparent conductive material, for example, of indium tin oxide (ITO). As a variation, if substrate 101 is transparent, the display device may be intended to emit light through its lower surface, in which case layer 119 may be made of an opaque conductive material, for example, a metal, preferably a reflective metal. In another variation, in the case where the display device is intended to emit light through its upper surface, and in the case where P-type layer 115 is a continuous layer extending over the entire surface of the pixel, conductive layer 119 may be made of an opaque conductive material, for example, a metal, and coat a portion only of the pixel surface, for example, less than half the pixel surface.

An example of a method of manufacturing a monolithic assembly of light-emitting cells comprising cells of different types capable of emitting light in different wavelength ranges has been described hereabove in relation with FIGS. 1 to 7.

To form a complete display device, an elementary control circuit, for example, based on MOS transistors, enabling to individually regulate the current flowing in the cell, and accordingly the light intensity emitted by the cell, should be connected to each light-emitting cell. The forming of such control circuits will not be detailed herein. As an example, it may be provided to hybridize with an array of light-emitting cells formed by the method of FIGS. 1 to 7, for example, by direct bonding, an integrated circuit formed inside and on top of a silicon substrate, for example, in CMOS technology, the integrated circuit comprising a corresponding array of elementary control circuits respectively connected to the different light-emitting cells.

An advantage of the method described in relation with FIGS. 1 to 7 is that it enables to simultaneously form, during a same sequence of epitaxy steps and by using a single mask 105, at least three types of light-emitting cells capable of respectively emitting in three different wavebands.

Various embodiments and variations have been described. It will be understood by those skilled in the art that certain features of these various embodiments and variations may be combined, and other variations will occur to those skilled in the art. In particular, although a preferred embodiment enabling to simultaneously form three types of light-emitting cells respectively emitting in blue, in green, and in red has been described hereabove, the described embodiments are not limited to this specific case. In particular, by varying the dimensions and/or the spacing of the pyramidal nanostructures and/or the compositions of the materials of active layer 115, light-emitting cells emitting in other wavebands than those mentioned hereabove may be formed. Further, an embodiment comprising a two-dimensional light-emitting cell (pixel B) and two different three-dimensional light-emitting cells (pixels G and R) has been described hereabove. As a variation, the number of different three-dimensional light-emitting cells may be greater than 2 to form a display device comprising at least four different types of pixels respectively emitting in different wavebands.

Further, to limit the stress and the risk of bending of substrate 101 on implementation of the different deposition steps of the above-described method, trenches (not shown) delimiting the different pixels of the device may be etched in semiconductor layer 103, for example along the entire height of layer 103, before the forming of mask 105.

Further, it should be noted that all the conductivity types of the above-described semiconductor layers may be inverted.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A light-emitting device comprising first, second, and third pixels capable of respectively emitting in first, second, and third wavelength ranges, wherein:
    the first pixel comprises a two-dimensional light-emitting cell comprising a vertical stack of a first doped semiconductor layer of a first conductivity type, of an active layer, and of a second doped semiconductor layer of the second conductivity type, each of the first and second doped semiconductor layers being a horizontal planar layer extending flat over the entire surface of the cell;
    each of the second and third pixels comprises a three-dimensional light-emitting cell comprising a plurality of nanostructures of same dimensions regularly distributed across the surface of the pixel, each nanostructure comprising a doped pyramidal semiconductor core of the first conductivity type, an active layer coating the lateral walls of the core, and a doped semiconductor layer of the second conductivity type coating the active layer; and
    the nanostructures of the second and third pixels have different dimensions and/or a different spacing, the device further comprising a substantially planar base semiconductor layer having a surface coated with a substantially planar dielectric masking layer, the masking layer comprising, opposite the first pixel, a single opening laterally delimiting the first semiconductor layer of the first pixel and, opposite each of the second and third pixels, a plurality of openings laterally delimiting the semiconductor cores of the second and third pixels, the first semiconductor layer of the first pixel and the semiconductor cores of the second and third pixels being arranged on top of and in contact with said surface of the base semiconductor layer, in said openings.

2. The device of claim 1, wherein, in each of the first, second, and third pixels, the active layer comprises an alternation of semiconductor layers of a first material and of semiconductor layers of a second material defining multiple quantum wells.

3. The device of claim 2, wherein, in each of the first, second, and third pixels, the first material is InGaN and the second material is GaN or InGaN having an indium concentration smaller than that of the first material.

4. The device of claim 1, wherein the first semiconductor layer of the first pixel and the semiconductor cores of the second and third pixels are made of N-type doped GaN or of N-type doped InGaN.

5. The device of claim 1, wherein the second semiconductor layer of the first pixel and the doped semiconductor layers of the second conductivity type of the second and third pixels are made of P-type doped GaN or of P-type doped InGaN.

6. A method of manufacturing the device of claim 1, wherein the first semiconductor layer of the first pixel and the semiconductor cores of the second and third pixels are simultaneously formed during a same epitaxy step.

7. The method of claim 6, wherein the first semiconductor layer of the first pixel and the semiconductor cores of the second and third pixels are formed by local epitaxy on a surface of a base semiconductor layer coated with a dielectric masking layer.

8. The method of claim 7, wherein the dielectric masking layer comprises, opposite each of the second and third pixels, a plurality of openings regularly distributed across the entire surface of the light-emitting cell of the pixel.

9. The method of claim 8, wherein the openings are formed by etching of the dielectric masking layer opposite pores of a film having a controlled porosity formed based on block copolymers.

10. The method of claim 6, wherein the active layers of the first, second, and third pixels are formed simultaneously during a same epitaxy step.

11. The method of claim 10, wherein the epitaxial growth conditions on forming of the active layers of the first, second, and third pixels are the following:
    growth temperature of 720° C. +/−30° C.;
    growth speed of 0.12 μm/h +/−0.007 μm/h;
    Indium/Gallium flow ratio between 2 and 5;
    V/III semiconductor ratio greater than 5,000; and
    pressure in the order of 400 mbar.

12. The method of claim 6, wherein the semiconductor layer of the first pixel and the semiconductor layers of the second and third pixels are simultaneously formed during a same epitaxy step.

* * * * *